US005214245A

United States Patent [19]

Bernhardt et al.

[11] Patent Number: 5,214,245

[45] Date of Patent: May 25, 1993

[54] PROTECTIVE CASING FOR OPTICAL INSTRUMENTS

[75] Inventors: Rainer Bernhardt, Rosbach-1; Reiner Waldschmitt, Eschborn-2, both of Fed. Rep. of Germany

[73] Assignee: Videor Technical E. Hartig GmbH, Rödermark-2, Fed. Rep. of Germany

[21] Appl. No.: 669,356

[22] Filed: Mar. 14, 1991

[30] Foreign Application Priority Data

Mar. 15, 1990 [DE] Fed. Rep. of Germany ....... 4008340

[51] Int. Cl.[5] .......................... H05K 5/00; H04N 5/30

[52] U.S. Cl. .................................... 174/52.1; 358/229

[58] Field of Search .................... 174/50, 52.1, 53, 54, 174/61, 62, 63, 65; 361/331, 332, 380, 419; 358/229, 254, 255; 439/211

[56] References Cited

U.S. PATENT DOCUMENTS

| | | | |
|---|---|---|---|
| 4,414,576 | 11/1983 | Randmae | 358/229 |
| 4,789,891 | 12/1988 | Kanayama et al. | 358/229 |
| 5,012,335 | 4/1991 | Cohodar | 358/229 |

FOREIGN PATENT DOCUMENTS

| | | |
|---|---|---|
| 0285922 | 12/1988 | European Pat. Off. . |
| 8600747 | 5/1986 | Fed. Rep. of Germany . |
| 2614438 | 10/1988 | France . |
| 2075114 | 11/1981 | United Kingdom . |

OTHER PUBLICATIONS

Video Security Produkt Katalog Mar. 1989 pp. 8–9.

*Primary Examiner*—Leo P. Picard
*Assistant Examiner*—Bot Ledinh
*Attorney, Agent, or Firm*—Felfe & Lynch

[57] ABSTRACT

A protective casing for optical instruments, particularly a weatherproof casing with a casing shell (2), a casing axis A—A, a front wall (3) and a backwall (4) located on each end of the casing shell, and a casing support (9) located on the underside, which is attached to a stationary base (12). With at least one electric cable (23*a*) leading to a connector plug (11) located on the backwall (4). A detachable cable casing (20) is provided to house the cables out of sight, which extends from the base (12) to the connector plug (11), and together with the wall elements of the protective casing forms a closed cable conduit (21). At least one electrical cable (23*a*) runs inside the cable casing (20). A particular advantage is that the cable casing first runs between the casing support (9) and the cable casing (20) parallel to the surface of the casing shell (2), forming the first segment (21*a*) of the cable conduit (21), and then is led in an angle around the back bottom edge (22) of the backwall (4). From there it runs forming the second segment (21b) of the cable conduit (21) to the connector plug (11), overlapping the same.

12 Claims, 9 Drawing Sheets

FIG.5
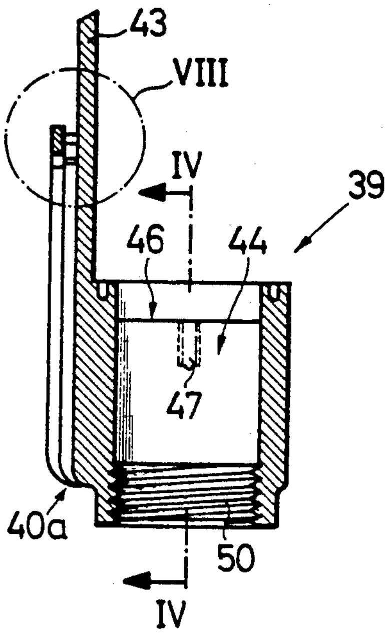
FIG.6
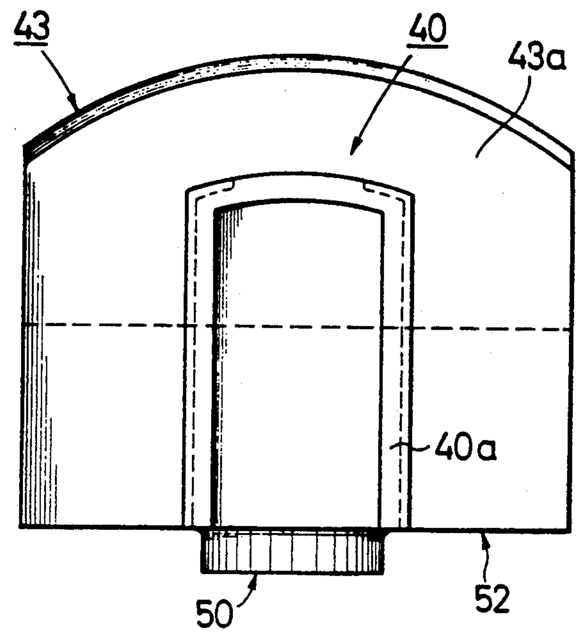
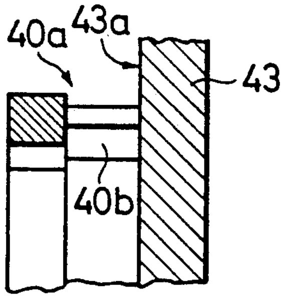
FIG.8
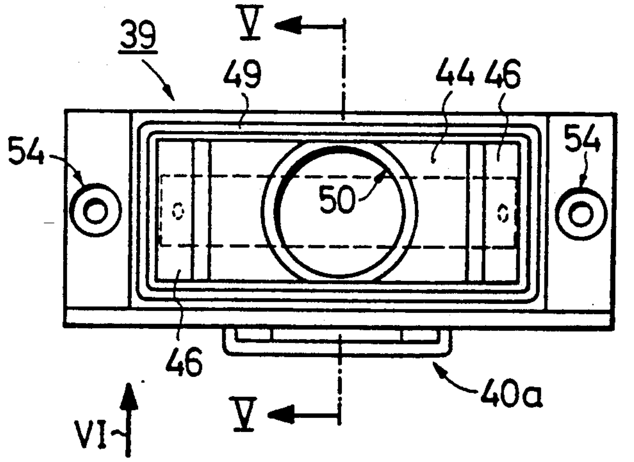
FIG.7

FIG. 11
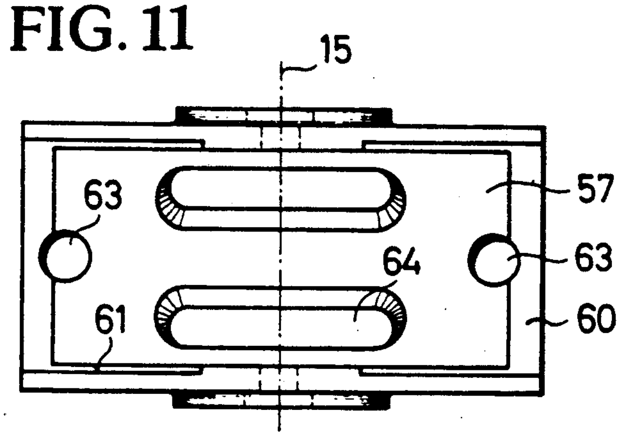
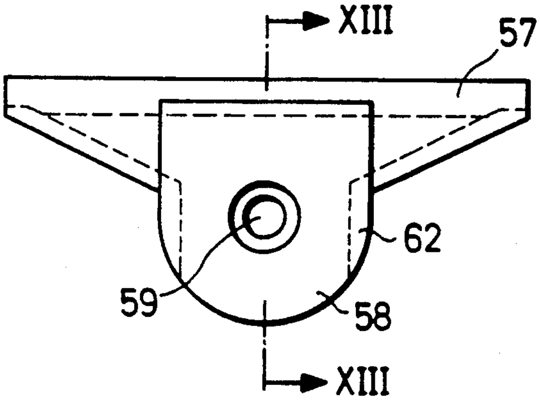
FIG. 12
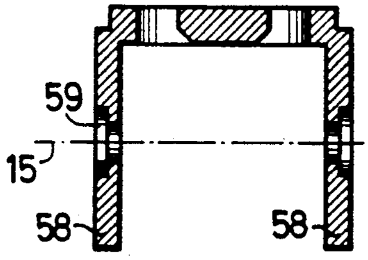
FIG. 13
FIG. 14
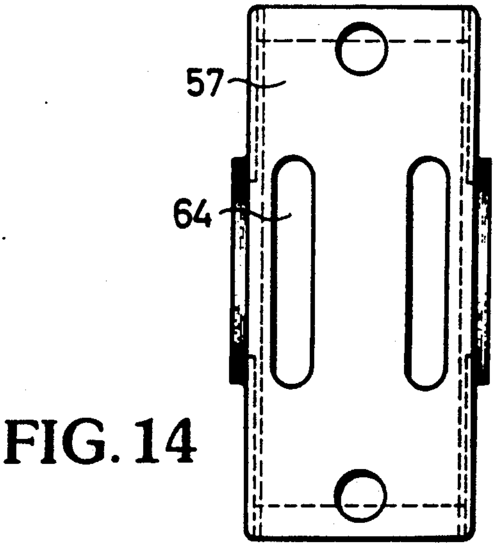

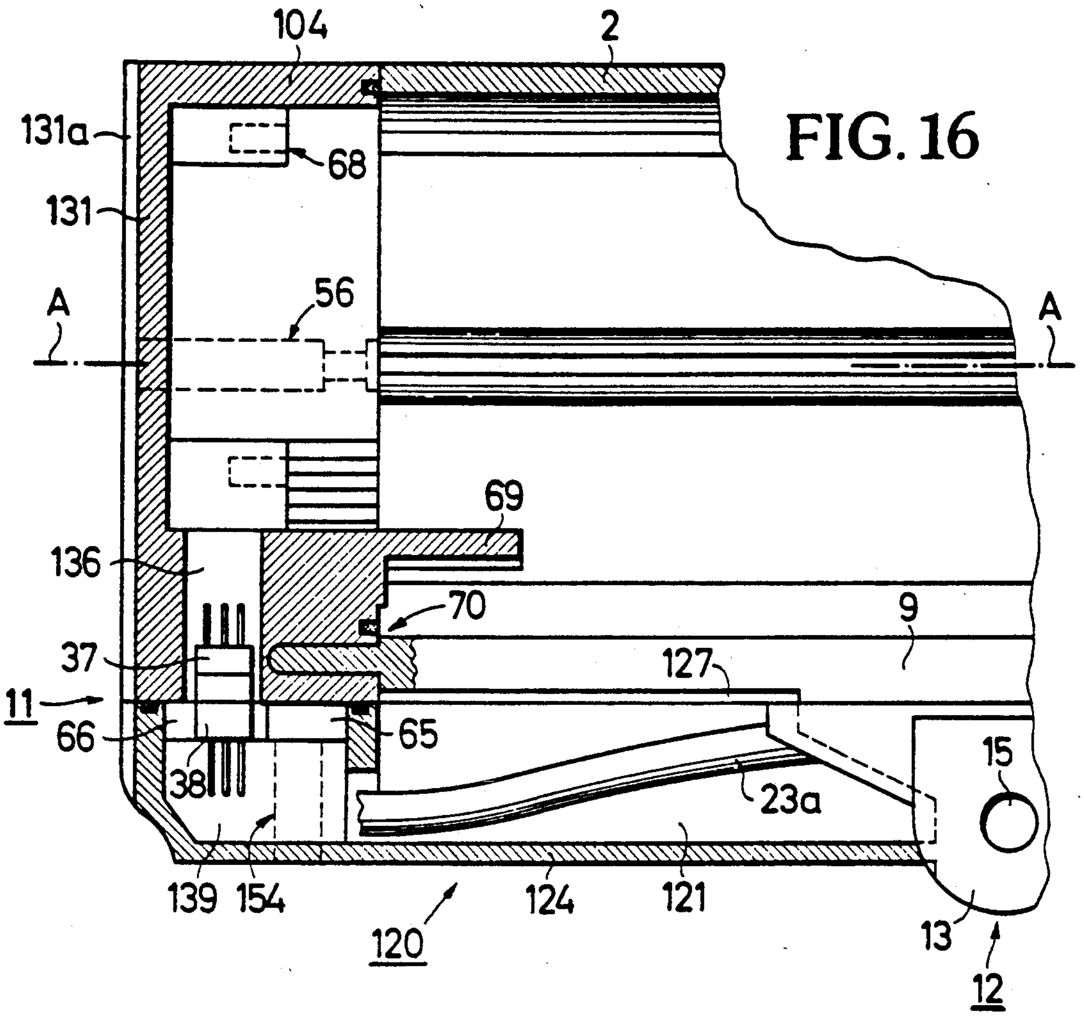
FIG. 16
FIG. 17
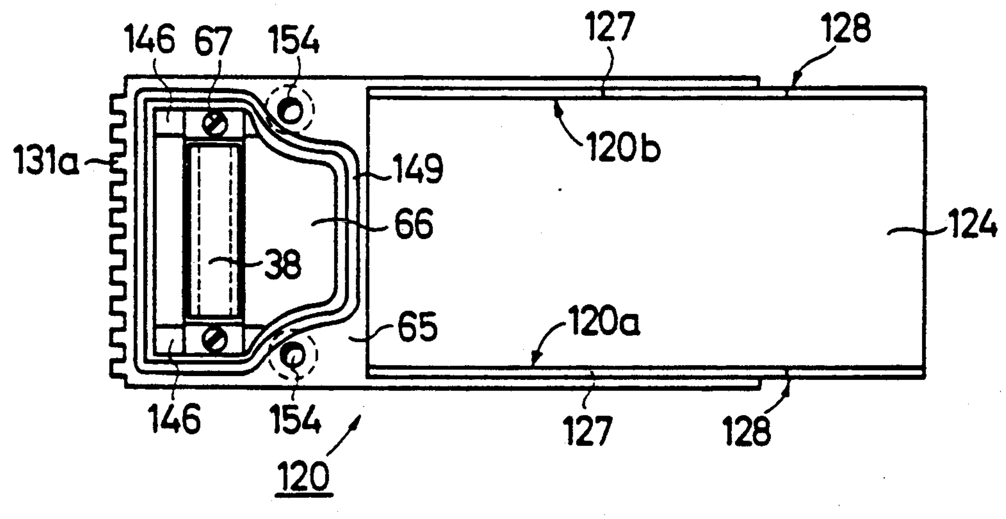

PROTECTIVE CASING FOR OPTICAL INSTRUMENTS

BACKGROUND OF THE INVENTION

The invention concerns a protective casing for optical instruments, in particular a weatherproof protective casing for surveillance systems with video cameras, with a casing shell, a casing axis A—A, with a front wall on one end and a back wall located on each end of the casing shell. A casing support is located on the underside of the casing shell for the fastening of the protective casing on a stationary base. At least one electric cable leading to a connector plug located in the backwall.

Such a protective casing is known to the applicant through the trade print script "VIDEO-Security", Edition 3/89, pages 8/9. Protective casings of this type are equipped with the appropriate optical instruments and the corresponding electrical equipment, once they have been installed in site by means of a wall bracket, a ceiling hanging or similar attachment. For the assembly, servicing and repair work as well as in case of future changes, the electric connection may have to be disconnected or the cables may have to be exchanged if necessary.

In the known protective casing the electric cables run from the place of attachment on a wall bracket directly to the backwall of the casing, and from here through a weatherproof cable conduit into the inside of the protective casing. Due to the fact that the weatherproof casing must be swivelled and tilted (the base forms a type of suspension) the cables must be sufficiently long in order to allow the movements in the area of the backwall of the protective casing. Such "open" cabling is not only unsightly but is also a vulnerable point for acts of sabotage.

The casing shell can consist of a segment of extruded light metal tube in any crosscut shape, such as square, rectangular, octagonal or round. The front wall and the backwall should preferably be light metal casings, the front wall has a window.

Front wall and backwall should preferably be screwed to the casing shell using weatherproofing seals.

SUMMARY OF THE INVENTION

The purpose of the invention is to provide a protective casing of the above described type which allows it to hide the cables without making the connecting and disconnecting of the cables too difficult.

A detachable cable casing with "U"-shaped wall elements facing each other, running from the base to the connector plug, is provided forms a closed cable conduit together with the wall elements of the protective casing, housing at least one electric cable overlapping the connector plug.

In the cable casing according to the invention, a cable conduit is formed using the surfaces of the casing shell, the casing support and if necessary of the casing backwall, in which the cable casing surrounding the cable conduit can be connected with and separated from the protective casing in a relatively short time, but not as short as would be required to cut the cables.

The assembly of the cable casing with the protective casing, according to the invention, is pleasing to the eye, the complete arrangement having closed outer surfaces which also helps to reduce to a minimum the amount of dirt accumulation.

Due to the fact that the cables are led through the base, the cables can be installed using the shortest route. In addition, when a plug connection is used, and when the casing is removed from the base, the plug must not be disconnected from the cable since the cable is not drawn through a narrow opening in this place.

Therefore, in order to provide access to the connector plug on the back side of the casing, it is of particular advantage to build a cable casing which runs between casing support and cable casing forming the first segment of the cable conduit, and then is led around the back bottom edge of the backwall forming the second segment of the cable conduit, running to the connector plug in the backwall, and overlapping the same.

It is further of particular advantage for the cable casing to have a vertical center plane running through the casing axis, and for the cable casing to be closed on at least three side of the circumference by "U"-shaped wall elements, in relation to sections running vertically to this center plane. Two of the wall elements form the sides whose free ends face the casing shell, the third wall element forming the crossbar of the "U".

In the corresponding casing back wall construction it is particularly advantageous, when the wall element forming the crossbar is "V"-shaped in a sectional plane which coincides with the center plane, forming a bottom part and a backwall part, in which the top portion between bottom part and backwall part is rounded.

In the location of the connector plug shown the cable casing can be built in a particularly compact construction when:

a) the backwall of the casing has an enclosing wall on the side facing away from the casing shell, which in a vertical sectional plane is built like an angle-shaped "V" forming a prism-shaped recess with a horizontal axis, and in which the aperture angle of the "V" is 90 degrees, and both sides of the "V" run in an acute angle in relation to the casing axis A—A;

b) a first plug connection is located in the upper side of the wall element which forms the "V";

c) a second plug connection which forms a linkage with the first plug connection is located in a plug casing, placed and sealed from the outside, in the upper wall element of the prism-shaped recess in the backwall, and when

DETAILED DESCRIPTION OF THE PREFERRED EMBODIMENT

Figure 1:
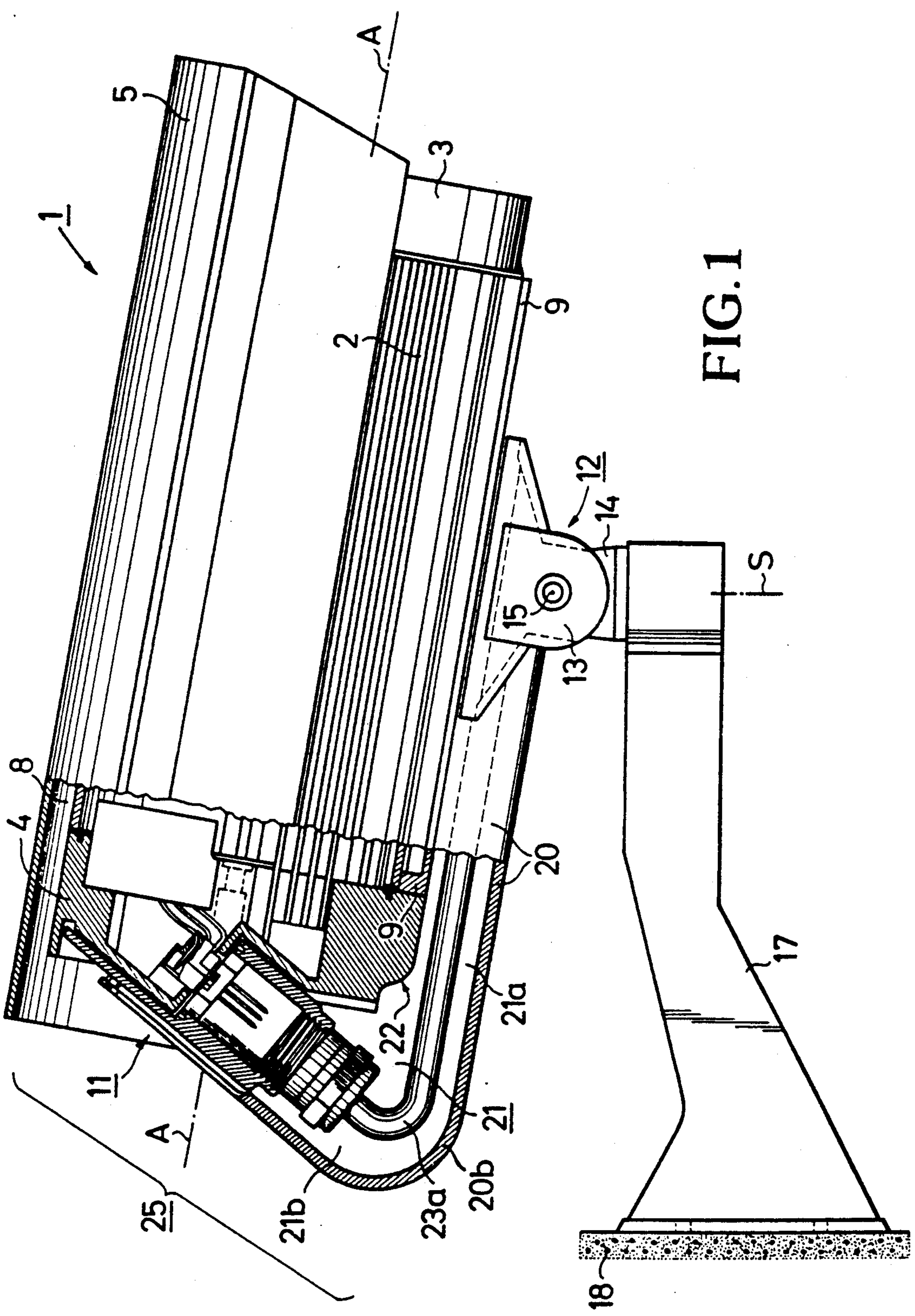
FIG. 1 a side view of the first construction example with a partial vertical axial cross-section through the back part of the protective casing which is attached to a wall bracket, FIG. 2 a partial segment of FIG. 1 at enlarged scale, FIG. 3 an end view of the backwall without equipment in the direction of the axis A—A in FIG. 2, FIG. 4 a longitudinal cut through the plug casing along the axis IV—IV in FIG. 5, FIG. 5 a cross-section of the plug casing along the line V—V in FIG. 7, FIG. 6 a plan view of the plug casing in direction of the arrow VI in FIG. 7, FIG. 7 an end view of the plug casing in direction of the arrow VII in FIG. 4, FIG. 8 a partial segment of FIG. 5 inside the circle VIII at enlarged scale, FIG. 9 a perspective view of the cable casing, FIG. 10 a partial segment through the object of FIG. 2 along the radial plane X—X, FIG. 11 a view from below of the upper base support, FIG. 12 a side view of the base support according to FIG. 11, FIG. 13 a cross-section through the base support according to FIG. 12 along the line XIII—XIII, FIG. 14 a plan view of the base support according to FIGS. 11 to 13, FIG. 15 a top view of the back side of the completely assembled protective casing in the direction of the axis A—A in FIG. 2, FIG. 16 a partial axial vertical section through the back portion of the second construction example similar to FIG. 2, but with an essentially flat outer backwall side, FIG. 17 a top view of the cable casing structurally connected through a plug casing and a second connector plug according to FIG. 16, FIG. 18 an outside view of the backwall of the casing according to FIG. 16, and FIG. 19 a view from below of the backwall according to FIGS. 16 and 18 after the removal of the cable casing, and with the first connector plug exposed.

FIG. 1 shows a weatherproof casing 1 for video cameras, which has a casing shell 2 consisting of a segment of a closed tube of extruded light metal. The lower portion is shown in the cross-section of FIG. 10, and shall be further explained in connection with the same.

Figure 15:
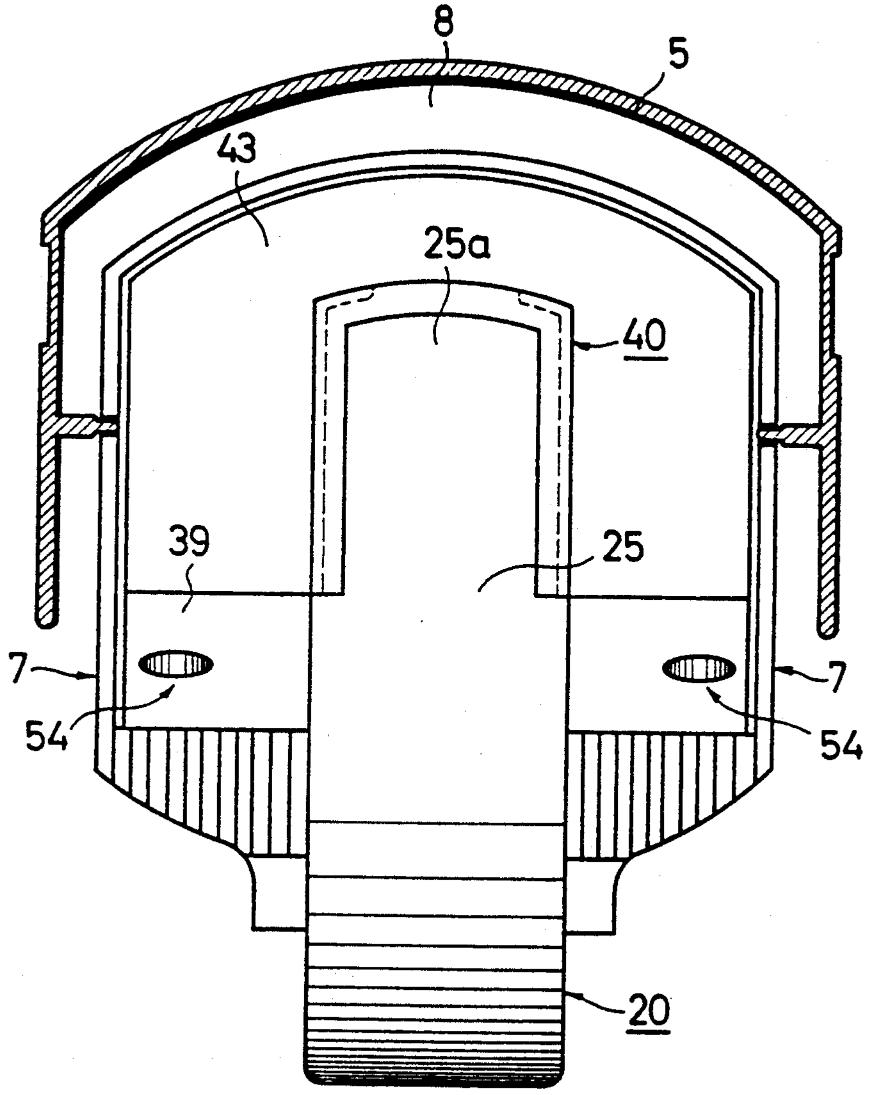

The casing shell 2 is hermetically closed in the front and the back with a front wall 3 and a backwall 4. The protective casing also includes a protective roof 5, which surrounds the casing shell 2 on its upper side 6 and above on most of its two side walls 7, leaving an air gap 8 (FIG. 15). The length of the protective roof 5 is such, that it overhangs the front side of the front wall 3 and the back side of the backwall 4 (FIG. 1).

The protective casing 1 also includes a casing support 9 which will be explained in more detail in FIG. 10. The casing support 9 is built in the shape of a rail along the length of the casing shell 2, rigidly connected to the backwall 4, and located under the underside 10 of the casing shell 2.

According to FIG. 1 the protective casing is attached to a base 12 consisting of two base members 13 and 14, connected by a pivot pin 15. The casing support 9 has an elongated slot 16 in the center which allows it to slide on the upper base support 13 in the direction of the casing axis A—A. It is attached with tightening screws (not shown), and fastened in such manner that the tilting axis 15 is as closely as possible located exactly underneath the center of gravity of the completely equipped protective casing.

The lower base member 14 can be swivelled around the swivel axis "S", and is attached to a wall bracket 17 which is screwed to a wall 18.

The necessary electric cables run through the wall bracket 17 and in the hollow space in the base members 13 and 14, and coming from the base 12 underneath the casing support 9 (FIG. 10) and underneath the underside of the backwall 4.

A connector plug is provided in the backwall 4, which will be explained in more detail in connection with FIG. 2. A cable casing 20 is included, which runs from the base 12 to the connector plug 11, first forming the first segment 21*a* of the cable conduit 21 which runs between the casing support 9 and the cable casing 20, parallel to the surface of the casing shell 2. Then the cable casing runs in an angle around the back bottom edge 22 of the backwall 4, and overlaps the connector plug 11 located in the backwall 4, forming the second segment 21*b* of the cable conduit 21. This is done in such fashion that the electric cables 23*a*, 23*b* and 23*c* which run from the base 12 to the connector plug 11, are conducted inside the cable casing 20 (see FIG. 10).

Figure 2:
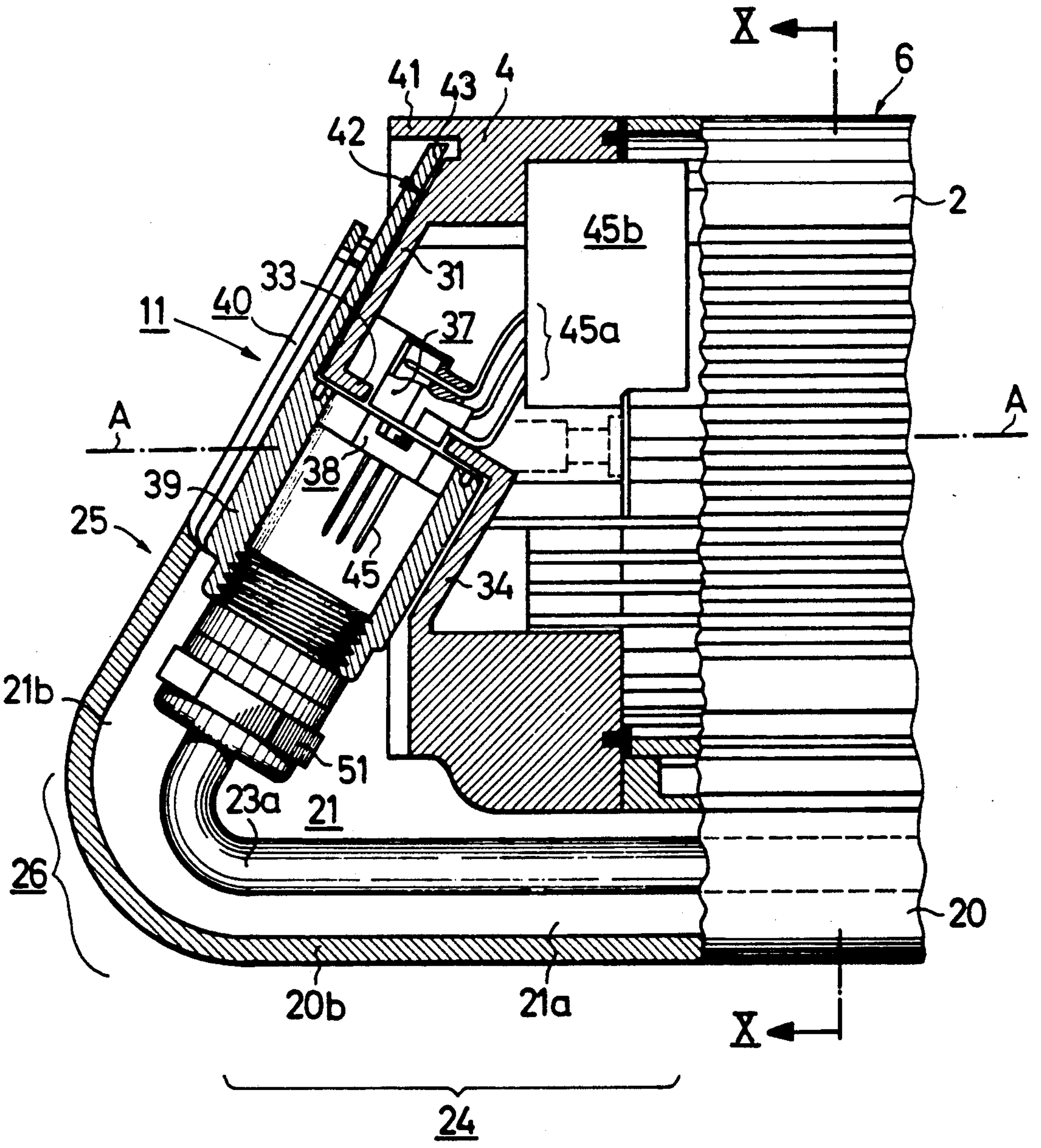
Figure 9:
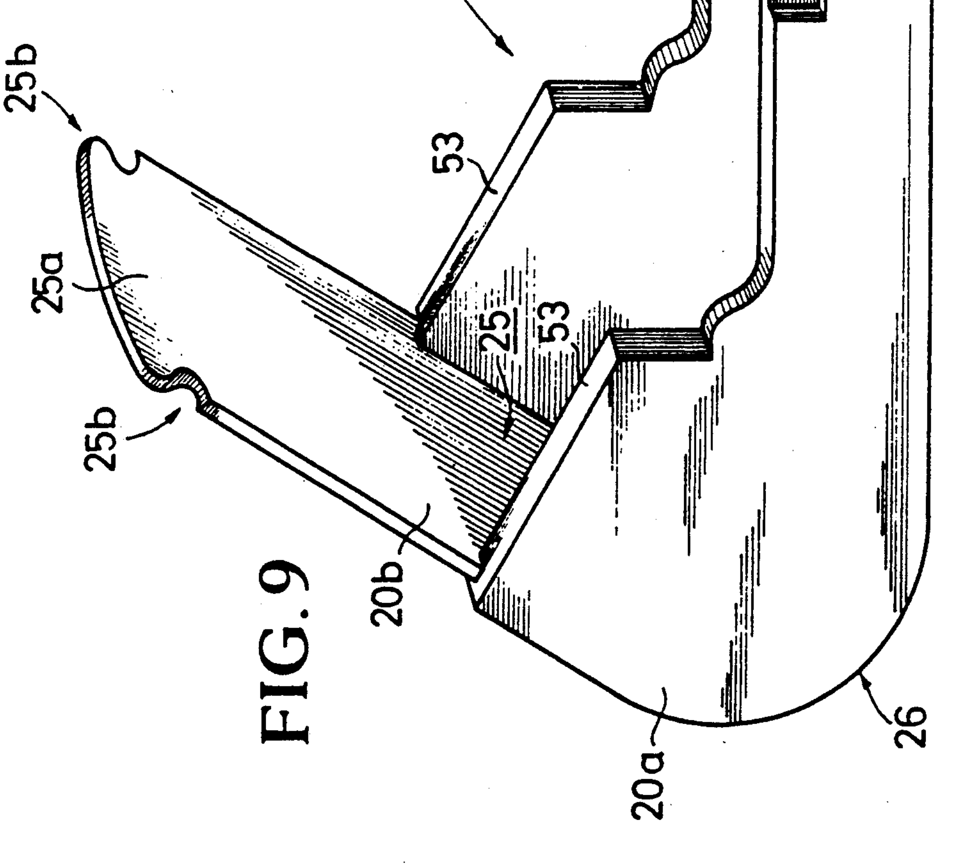

FIG. 2 in connection with FIG. 9 show clearly that the cable casing 20 has a vertical central plane which runs through the casing axis A—A, therefore coinciding with the sectional plane in FIG. 2. With regards to sections running vertical to this central plane, the casing 20 is enclosed on at least three sides of its circumference by "U"-shaped wall elements 20*a*, 20*b* and 20*c* facing each other. The two wall elements 20*a* and 20*c* form the sides of the "U", whose free ends face the casing shell 2 and the backwall 4. The third wall element 20*b* forms the crossbar of the "U". Due to the spatial course of the bottom sides of the casing shell 2 and the backwall 4, and of the back side of the backwall, the length of the sides is different and graded, as can be seen in FIG. 9.

FIGS. 1, 2 and 9 show clearly that the wall element 20*b* which forms the crossbar is "V"-shaped in a sectional plane that coincides with the central plane, forming a bottom part 24 and a rear wall 25, where the top part 26 between the bottom part and the backwall part has a rounded shape.

Figure 10:
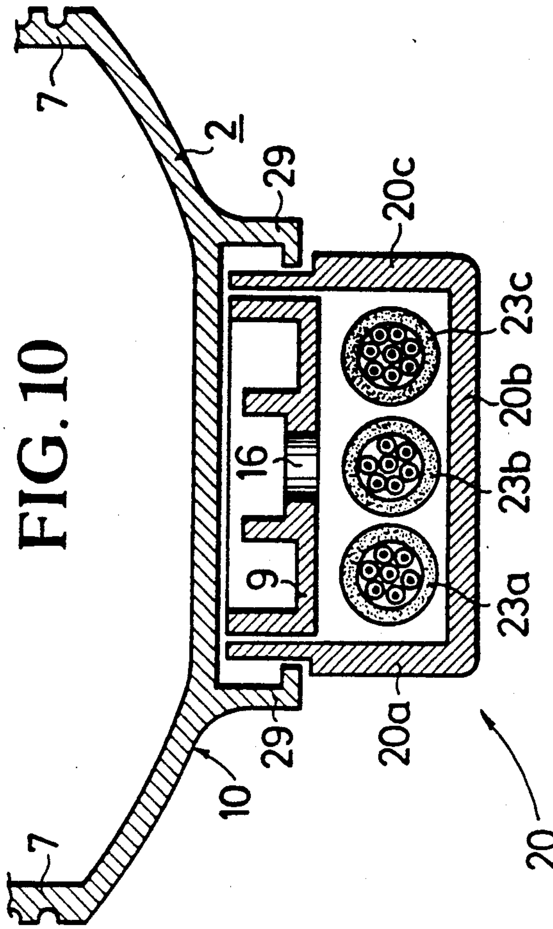

The wall elements 20*a* and 20*c* which form the sides, are equipped with a first set of indentations 28 along the upper parallel edge 27 in the area of the casing shell 2, intended for the insertion of longitudinal ribs 29, located on the underside 10 of the casing shell 2 (see also FIG. 10).

The wall elements 20*a* and 20*c* which form the sides, are equipped on the free ends of the cable casing 20 located in the area of the casing shell 2, with a second set of indentations 30, to be inserted in the corresponding complementary indentations of the upper base member 13. The interaction between the cable casing 20 and the upper base member 13 is shown in FIG. 1. The details of the base support will be further discussed in FIGS. 11 to 14.

The nature of the connector plug 11 will be discussed in more detail in connection with FIG. 2:

The backwall has an enclosing wall 31 on the side facing away from the casing shell 2, which in a vertical sectional plane through the axis A—A, forms a prism-shaped recess 32 open towards the outside (FIG. 3), whose axis runs horizontally. The prism-shaped recess is defined by an upper wall element 33 and a lower wall element 34, placed at an angle of 90 degrees in relation to each other, both running in an acute angle to the casing axis A—A. The wall elements 33 and 34 form the sides of a prism shaped recess 32 having a "V" profile the top line 35 of this "V" runs horizontally (FIG. 3).

The upper wall element 33 has a square recess 36, housing the first plug connection 37 (main part). The second plug connection 38 is attached to the plug casing 39, which will be explained in more detail in FIGS. 4 to 7. Together both plug connections 37 and 38 form a coupling. The connection direction runs vertically to a separating line, which will not be explained in more detail, located between the plug connections 37 and 38, and vertically to the upper wall element 33.

As can be seen in FIGS. 1, 2 and 15, the plug casing 39 is sealed from outside and attached to the backwall 4, namely screwed to the upper wall element 33 of the prism-shaped recess, with an interposed seal (not shown). The backwall part 25 of the cable casing 20 is further connected to the plug casing, i.e. with a dovetail joint 40, which is also explained in more detail below.

Figure 3:
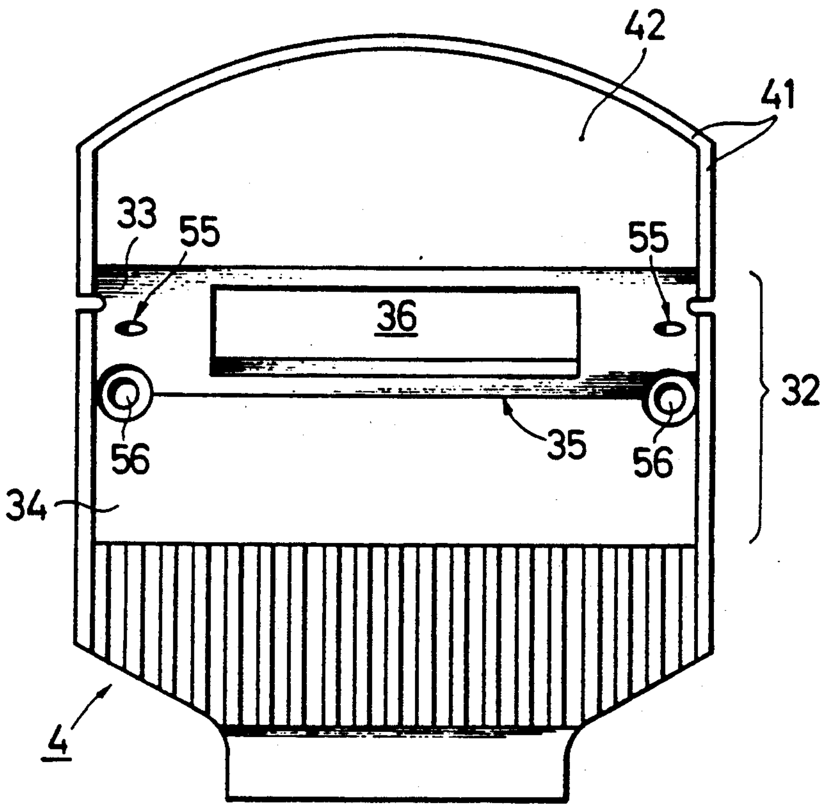

FIGS. 2 and 3 show that the backwall 4 has a protruding edge 41, parallel to the casing axis A—A on the upper portion of the side facing away from the casing shell 2, and on the sides, and a contact surface 42 running parallel to the connection direction of the connector plug, and vertically to the upper wall element 33 of the prism-shaped recess 32, and stretching to the edge 41.

The plug casing 39 has a cover plate 43 on the side facing away from the connector plug 38,.which runs parallel to the mentioned connection direction, and which rests superposed on the contact surface 42. In addition the cover plate 43 has on its outside **43*a* means for the fastening of the backwall parts 25 of the cable casing 20 in the form of a dovetail guide 40*a*. The dovetail guide 40*a* serves for the insertion of the tongue shaped extension 25*a* of the backwall part 25, and where the insertion direction of the dovetail guide 40*a* runs in the central plane of the cable casing 20**.

This interaction is clearly visible in FIGS. 5, 6 and 15.

Figure 4:
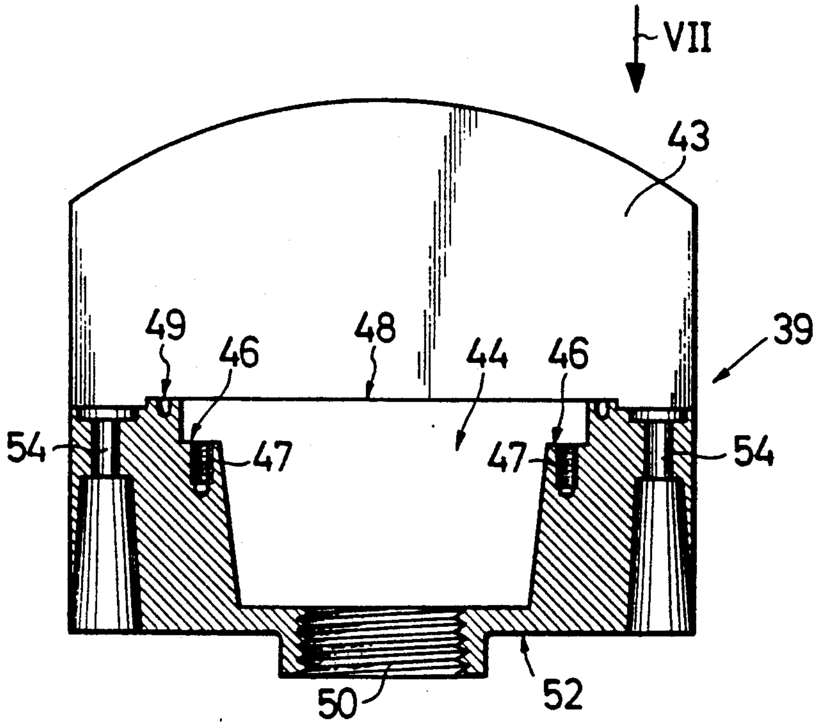

It is understood that the plug casing 39 can only be screwed to the backwall 4 if it has been turned 180 degrees from its position shown in FIG. 4, around a vertical axis, to the position shown in FIG. 6. This position is also shown in FIG. 15.

According to FIGS. 4 to 7 the plug casing 39 has a hollow space 44 inside to run the cables. Three of these conductors 45 are indicated in FIG. 2. The conductor **45*a* (only one of three shown) runs from the connector plug 37 to an electronic part 45*b***, in this example a power pack.

The plug casing 39 also has shoulder surfaces 46 on its upper side, on both sides of the hollow space 44, with tapholes 47 for the installation and attachment of the corresponding connector plug 38 (FIG. 2). In addition the plug casing 39 has a sealing surface 48 surrounding the upper opening of the hollow space 44 which serves to connect it with the opposite wall element 33 of the prism-shaped recess 32. This sealing surface 48 has a sealing groove 49 closed in its periphery (square) (FIG. 7).

The plug casing 39 has a taphole 50 on its underside for a stuffing box union 51, shown in FIG. 2. The taphole 50 is surrounded in one portion of its length by a collar—not specified in more detail—facing down. In addition a flat stop face 52, for two front edges 53 of the cable casing 20 is located on the same underside outside the mentioned collar (see FIG. 9).The plug casing 39 has on its two outer sides two screw canals 54 running parallel to the connection direction which serve to connect the wall element 33 located opposite the sealing surface 48 with screws. The corresponding tapholes 55 are shown in FIG. 3. The screw canals 56 shown in FIG. 3 serve to screw the backwall 4 to the casing shell 2 which, however, in this context is irrelevant.

As can be seen in more detail in FIGS. 8 and 9, the upper end of the tongue shaped extension **25*a* of the rear wall 25 is connected by means of locking elements 25*b* with the dovetail guide 40*a*. The latter has complementary locking catches 40*b*** in the corresponding places.

FIG. 10 also shows how the cable casing 20 is attached to the underside 10 of the casing shell 2. A parallel walled gap is located on each side of the casing support 9, in which the cable casing 20 is inserted in those places, where the first set of indentations 28 is located. The upper tapered ends of the sides then abut with their longitudinal edges 27 on the lower boundary surfaces of the casing shell 2 between the longitudinal ribs 29, making a lateral shifting impossible. By means of a draw-in bolt the cable casing 20 can be braced against the casing shell 2.

The details of the upper base support 13 are explained by means of FIGS. 11 to 14 as follows: The upper base support 13 is formed like an "U" in relation to a plane of symmetry placed across the tilting axis 15, and has a flange plate 57 placed above which forms the crossbar of the "U", on which the casing support 9 rests, and two lateral sides 58 parallel to each other with tapholes 59 for the first pin in the tilting axis. The dotted lines in FIGS. 12, 13 and 14 clearly show that the edges located underneath the flange plate 57 have indentations 60, 61 and 62 on the inside, for the insertion of the complementary indentations 30, on the free end of the bottom part 24 of the cable casing 20. This way the cable casing 20 engages with its lower free end with the base member 13 in a form-locking fashion, thus sealing this portion to a large extent. The base member 13 is attached to the casing support 9 with screws, which are passed through the tapholes 63. When these screws are loose they can be slid in the elongated slot 16 (FIG. 10). The slots 64 in the flange plate 57, for instance, are used to introduce cables (not shown) into the hollow space of the casing support 9, if required. In this case, however, the connector plug would have to be disconnected from the corresponding cable, if the protective casing together with the casing support has to be connected or disconnected from the cable.

FIGS. 16 to 19 describe a second example of the invention. The same reference symbols have been used for the same or similar parts. For different parts the number 100 has been added to the reference symbols.

This example basically differs from the one according to FIGS. 1 to 15 in that the connection direction of the connector plug runs perpendicularly to the casing axis A—A. This allows a flat construction of the enclosing wall 131 of the backwall 104—except for the cooling ribs **131*a*—. A recess 136 is located in the lower portion of the backwall 104, whose principal plane also runs vertically to the axis A—A. This recess opens into the lower flat boundary surface of the backwall 104. The first connector plug is located in the area of the aperture of the recess 136, whose cables and conductors are only indicated here. A cable casing 120 is fixed on the underside of the casing shell 2 and the backwall 104, which surrounds an essentially rectilinear cable conduit 121. The back part of the cable casing 120 is built in the form of a plug casing 139, forming one piece with the same. The plug casing 139 is limited on the top by a wall element 65, which has a recess in which a second connector plug 38 has been inserted. The unit is attached by means of screws 67 to the shoulder surface 146. The recess 66 is surrounded by a sealing groove 149 closed in its periphery, in which a gasket—not specified in detail—is installed. The cable casing 120 is screwed to the underside of the backwall 104 by means of screws and the corresponding screw canals 154. The separating line between this underside and the plug casing 139 runs parallel to the axis A—A, as shown in FIG. 16**.

The cable casing 120 extends to the right of the plug casing 139 through a bottom part 124 and two side walls 120*a* and 120*b*, which project from it at a right angle, and which together represent a "U"-shaped section in which the bottom part 124 forms the crossbar. In this area the shape of the cable casing 120 is similar to that of the cable casing 20 shown in FIG. 9. The similarities also apply to the overlap of the edge facing away from the plug casing 139 into the upper base member 13 of the base 12, therefore the details will not be repeated. It is also understood that the back end of the cable casing 120 and the plug casing 139 are in alignment with the inclosing wall 131, and this also in relation to the cooling ribs 131*a*. Regarding the plug casing 120 only the upper edges 127 and the indentations 128 which allow the engagement with the longitudinal ribs 29 and the base member 13, are worth mentioning.

FIG. 16 also shows a fastening surface 68 for an electronic part (e.g. power pack), a coupling flange 69 to attach an instrument support (not shown), and a connector plug 70 for the rigid connection of the backwall 104 with the casing support 9.

Figure 18:
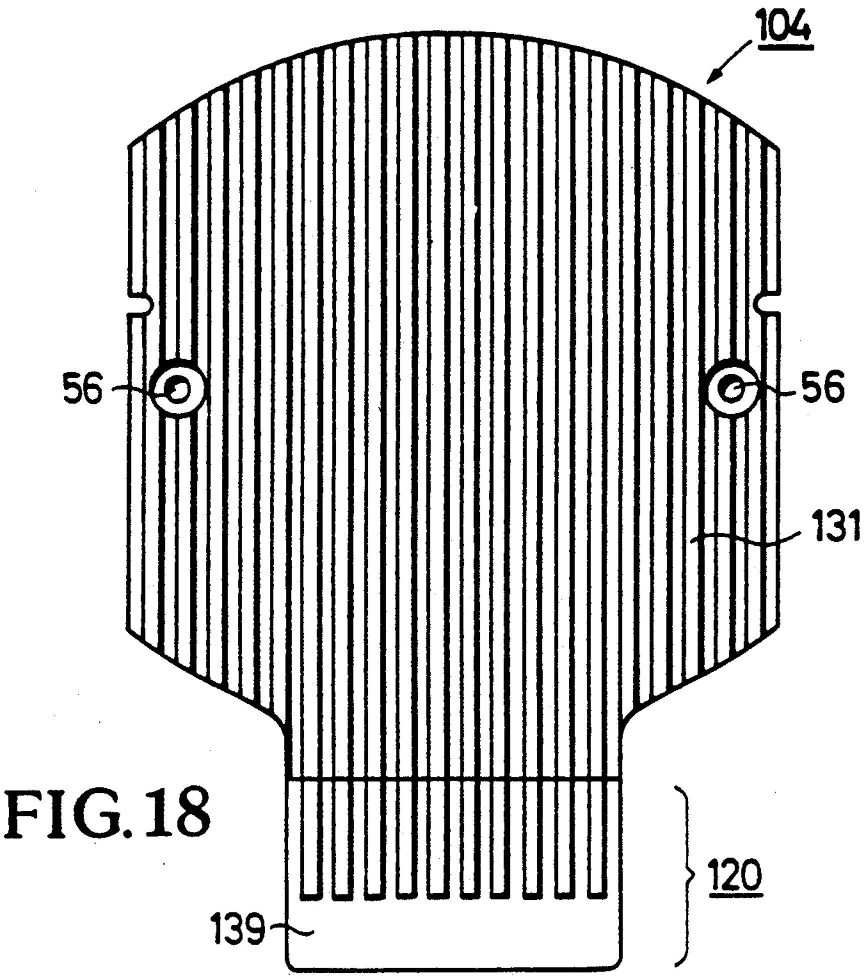
Figure 19:
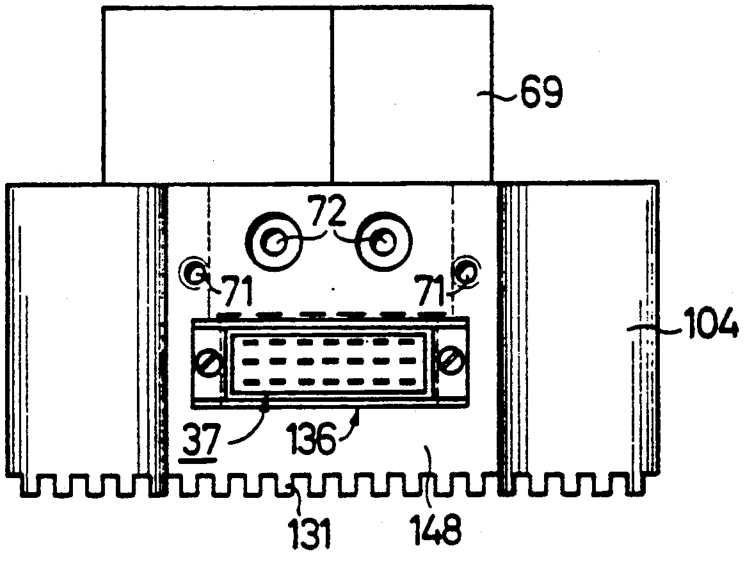

FIG. 18 shows the closed view of the entire back of the casing. FIG. 19 shows how the first connector plug 37 is inserted in the recess 136. Tapholes 71 serve to screw in the draw-in bolts in the screw canals 154. The screw holes 72 are intended to screw in the fastening screws for the casing support 9. The sealing surface 148 surrounding the recess 136 supports the profile washer in the sealing groove 149.

In order to remove the cable casing 120 shown in FIG. 16 downwards, the entire protective casing must naturally be turned slightly upwards around the base 12, after loosening the screw fixing the pivot pin on the tilting axis 15. In the example according to FIGS. 1 to 15 this is not required, because the connector plug 11 is accessible from the back. But if the protective casing is tilted accordingly, it is possible in some cases to remove the cable casing 12 downwards, without loosening the screw fastenings in the base 12.

We claim:

1. Protective casing for optical apparatus comprising:

a base, a casing support mounted to said base, a tubular casing shell having a longitudinal axis, a front end, a rear end, and a bottom extending therebetween, said bottom being mounted on said casing support, a backwall attached to said rear end of said casing shell, said backwall having connector plug means therein, a detachable cable cover which fits over part of said backwall and part of said casing support to form a cable conduit from said connector plug means to said base.

2. Protective casing as in claim 1 wherein said cable conduit comprises a first segment extending from said base parallel to said longitudinal axis of said casing shell, and a second segment extending from said first segment to said plug.

3. Protective casing as in claim 2 wherein said cable cover, in said first segment of cable conduit, comprises a crossbar and two wall elements upstanding from said crossbar toward said casing shell to form a U-shaped cross section.

4. Protective casing as in claim 3 wherein said cable cover, ion said second segment of cable conduit, comprises a rear wall which joins said crossbar in a rounded part, said crossbar and said backwall lying in planes at an acute angle to each other.

5. Protective casing as in claim 3 wherein said casing shell has longitudinal ribs extending downward therefrom parallel to said longitudinal axis, said wall elements having first indentations which engage said longitudinal ribs.

6. Protective casing as in claim 3 wherein said wall elements have second indentations which engage said support.

7. Protective casing as in claim 1 wherein said backwall comprises an upper wall element and a lower wall element which form a prism shaped recess facing said cable cover, said connector plug means comprises a first plug member in said upper wall element and a second plug member connected to said first plug member, and said protective casing further comprises a plug casing fixed to said upper wall element, said plug casing being at least partially enclosed by said cable cover.

8. Protective casing as in claim 7 wherein said backwall further comprises a contact surface perpendicular to said upper wall element and extending from said upper wall element to an upper edge which extends parallel to said longitudinal axis over said contact surface, and said plug casing comprises a cover plate which extends over said contact surface, said cover plate having thereon means for fixing said cable cover thereto.

9. Protective casing as in claim 8 wherein said means for fixing comprises a dovetail guide, said cable cover having a tongue shaped extension received in said dovetail guide in a direction parallel to said cover plate.

10. Protective casing as in claim 9 further comprising locking means for retaining said tongue shaped extension in said dovetail guide.

11. Protective casing as in claim 7 wherein said plug casing comprises a hollow space having means for fixing said second connector plug therein, a sealing surface for fixing against said upper wall element, a tapped hole for screwing a stuffing box union to said plug casing so that cables may enter said hollow space from said cable conduit.

12. Protective casing as in claim 1 wherein said casing support comprises a flange plate having two parallel lateral sides extending downward therefrom, said sides having respective coaxial holes for receiving a pivot pin therethrough, said flange and said sides having indentation means for complementary mating with said cable cover.

* * * * *

UNITED STATES PATENT AND TRADEMARK OFFICE

CERTIFICATE OF CORRECTION

PATENT NO. : 5,214,245

DATED : May 25, 1993

INVENTOR(S) : Bernhardt et al.

It is certified that error appears in the above-indentified patent and that said Letters Patent is hereby corrected as shown below:

Column 2, lines 48-49: Insert --d) the backwall part of the cable casing is connected with the plug casing.--;

Column 6, line 15: "the tilting" should read --the pivot pin on the tilting--;

Column 8, line 5: "ion" should read --in--;

Column 8, lines 51-52: Insert --means for fixing said plug casing to said upper wall element, and--.

Signed and Sealed this

Fourth Day of October, 1994

Attest:

BRUCE LEHMAN

*Attesting Officer*

*Commissioner of Patents and Trademarks*